(12) United States Patent
Lin et al.

(10) Patent No.: US 7,394,637 B2
(45) Date of Patent: Jul. 1, 2008

(54) SENSE AMPLIFIER WITH LEAKAGE COMPENSATION FOR ELECTRICAL FUSES

(75) Inventors: Sung-Chieh Lin, Thubei (TW); Hung-Jen Liao, Hsin-Chu (TW); Fu-Lung Hsueh, Hsinchu (TW); Jiann-Tseng Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 390 days.

(21) Appl. No.: 11/304,174

(22) Filed: Dec. 15, 2005

(65) Prior Publication Data

US 2007/0139843 A1  Jun. 21, 2007

(51) Int. Cl.
*H02H 5/04* (2006.01)
(52) U.S. Cl. ..................... 361/104; 327/525
(58) Field of Classification Search ......... 361/103–104; 327/525
See application file for complete search history.

(56) References Cited

U.S. PATENT DOCUMENTS

| | | | | |
|---|---|---|---|---|
| 5,959,445 | A * | 9/1999 | Denham | 323/315 |
| 6,417,720 | B1 * | 7/2002 | Denham | 327/525 |
| 6,995,601 | B2 * | 2/2006 | Huang et al. | 327/525 |
| 7,119,603 | B2 * | 10/2006 | Newman | 327/525 |
| 7,215,175 | B1 * | 5/2007 | Mandal et al. | 327/525 |
| 7,221,210 | B2 * | 5/2007 | Parker et al. | 327/525 |

* cited by examiner

*Primary Examiner*—Michael J Sherry
*Assistant Examiner*—Terrence R Willoughby
(74) *Attorney, Agent, or Firm*—Kirkpatrick & Lockhart Preston Gates Ellis LLP

(57) ABSTRACT

A sense amplifier for detecting a logic state of a selected electrical fuse cell among a number of unselected electrical fuse cells includes a bias module coupled to a power supply for generating a first current, and a tracking module coupled to the bias module for generating a second current. A current supplier is coupled to the bias module and the tracking module for generating a third current substantially equal to a sum of the first and second currents scaled by a predetermined factor, the third current being diverted into a first sub-current flowing through the selected electrical fuse cell and a second sub-current leaking through the unselected electrical fuse cells. The tracking module is so configured that the second current scaled by the predetermined factor is substantially equal to the second sub-current, thereby avoiding the first sub-current to be reduced by the second sub-current.

20 Claims, 3 Drawing Sheets

US 7,394,637 B2

SENSE AMPLIFIER WITH LEAKAGE COMPENSATION FOR ELECTRICAL FUSES

BACKGROUND

The present invention relates generally to integrated circuit (IC) designs, and more particularly to a sense amplifier with leakage compensation for electrical fuse cells.

Electrical fuses are often utilized in modern ICs. Typically, they are designed to blow when a current through the fuses exceeds a pre-determined threshold. When the fuses are programmed or "blown," although not necessarily physically broken, they enter into a high impedance state. Electrical fuses are commonly used for making adjustments and repairs that are performed as late as after the chip is packaged. Since wirings are allowed at the two ends of the fuses, they can be flexibly implemented within the IC. This flexibility makes the electrical fuses desirable components for IC designs.

Conventionally, an IC includes a plurality of electrical fuse cells, each of which has at least one electrical fuse serially coupled to at least one switch device. A sense amplifier is typically implemented in the IC to detect a sensing current flowing through the selected electrical fuse cell in order to determine its logic state. The voltage level of the sensing current varies depending on the resistance of the fuse of the selected cell. The sense amplifier outputs a signal indicative of whether the fuse is blown or not, based on the voltage level of the sensing current.

During the sensing process, only one or few electrical fuse cells are selected. Ideally, the unselected electrical fuse cells should not allow an electrical current to pass thereacross. However, in reality, part of the sensing current often leaks through the unselected electrical fuse cells. This reduces the sensitivity of the sense amplifier in responding to a change of the fuse resistance. In some cases, the leakage current would cause the sense amplifier fail to detect a fuse cell that is blown.

Thus, desirable in the art of IC design is a sense amplifier with leakage current compensation features for electrical fuse cells.

SUMMARY

The present invention discloses a sense amplifier for detecting a logic state of a selected electrical fuse cell. In one embodiment of the present invention, the sense amplifier includes a bias module coupled to a power supply for generating a first current, and a tracking module coupled to the bias module for generating a second current. A current supplier is coupled to the bias module and the tracking module for generating a third current substantially equal to a sum of the first and second currents scaled by a predetermined factor, the third current being diverted into a first sub-current flowing through the selected electrical fuse cell and a second sub-current leaking through the unselected electrical fuse cells. The tracking module is so configured that the second current scaled by the predetermined factor is substantially equal to the second sub-current.

The construction and method of operation of the invention, however, together with additional objectives and advantages thereof will be best understood from the following description of specific embodiments when read in connection with the accompanying drawings.

DESCRIPTION

Figure 1:
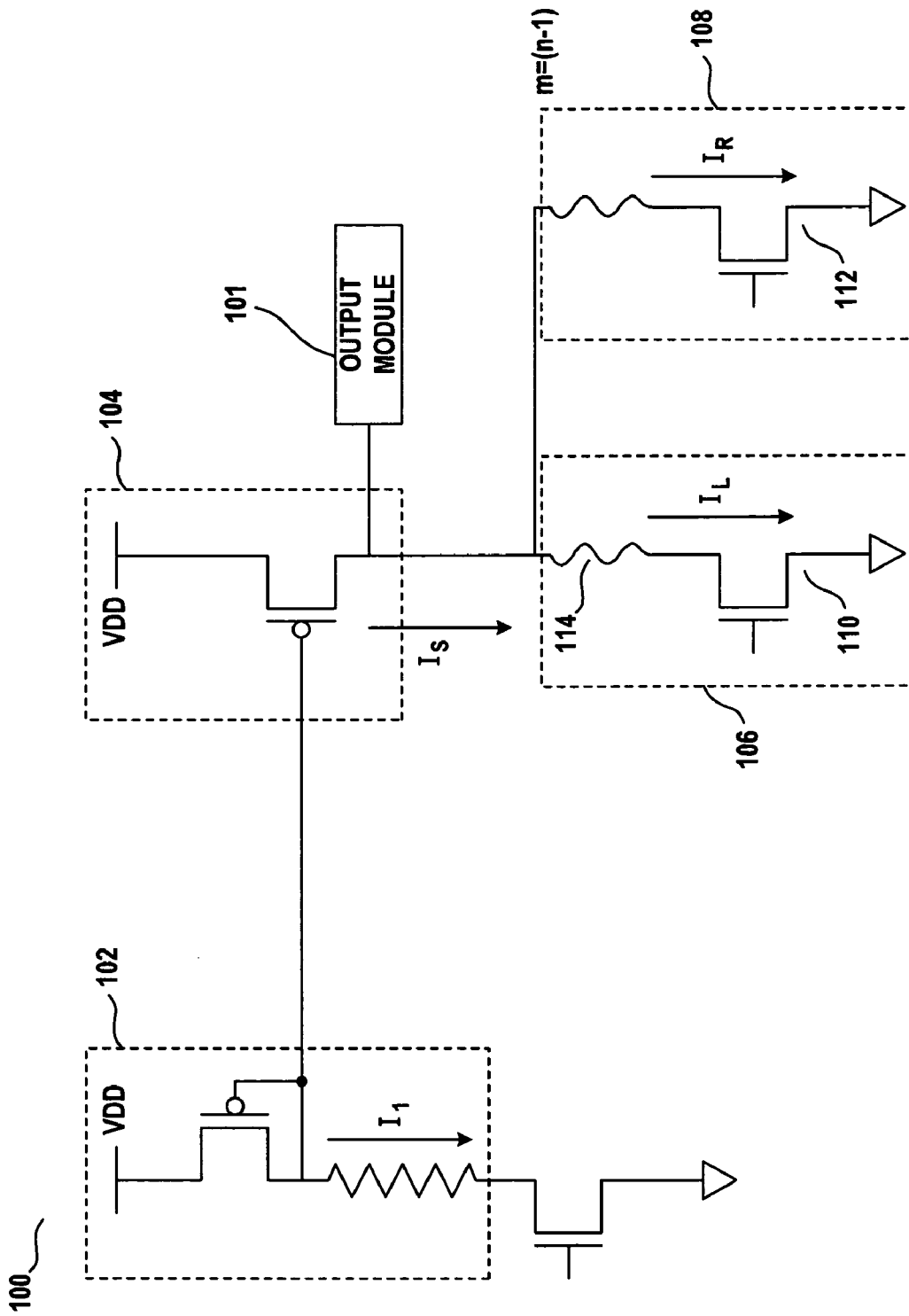
FIG. 1 schematically illustrates a conventional sense amplifier for electrical fuse cells.

FIG. 1 schematically illustrates a conventional sense amplifier 100 for a plurality of electrical fuse cells. The sense amplifier 100 includes an output module 101, a bias module 102, and a current supplier 104, which is coupled to a selected electrical fuse cell 106 and a number of unselected electrical fuse cells 108. The bias module 102 and the current supplier 104 work together as a current mirror, such that the current supplier 106 generates a sensing current Is, which is substantially equal to a first current $I_1$ generated by the bias module 102 multiplied by a predetermined constant. The switch device 110 in the selected cell 106 is turned on for allowing the sensing current Is to flow therethrough to ground, and the switch devices 112 in the unselected electrical fuse cells 108 are all turned off to prevent the sensing current Is to pass thereacross. Note that while there is only one set of fuse and switch device is depicted in the box showing the unselected electrical fuse cells 108, it conceptually represents n–1 cells where n is the total number of the electrical fuse cells.

Ideally, the sensing current Is should flow through the selected electrical fuse cell 106, without leaking through the unselected cells 108. However, in reality, the switch devices 112 cannot be turned off perfectly, and part of the sensing current Is would leak therethrough. The current passing through the selected electrical fuse cell 106 is denoted as $I_L$, and the current leaking through the unselected electrical fuse cells 108 is denoted as $I_R$, where Is is substantially equal to the sum of $I_L$ and $I_R$. As a result, the actual current flowing through the switch device 110 is less than the sensing current Is. This reduces the sensitivity of the sense amplifier 100, which detects whether the fuse 114 within the selected cell 106 is blown or not based on the voltage level of the sensing current Is. As such, the output module 101 may fail to generate an output signal properly indicating the state of the electrical fuse 114 in the selected cell 106.

Figure 2:
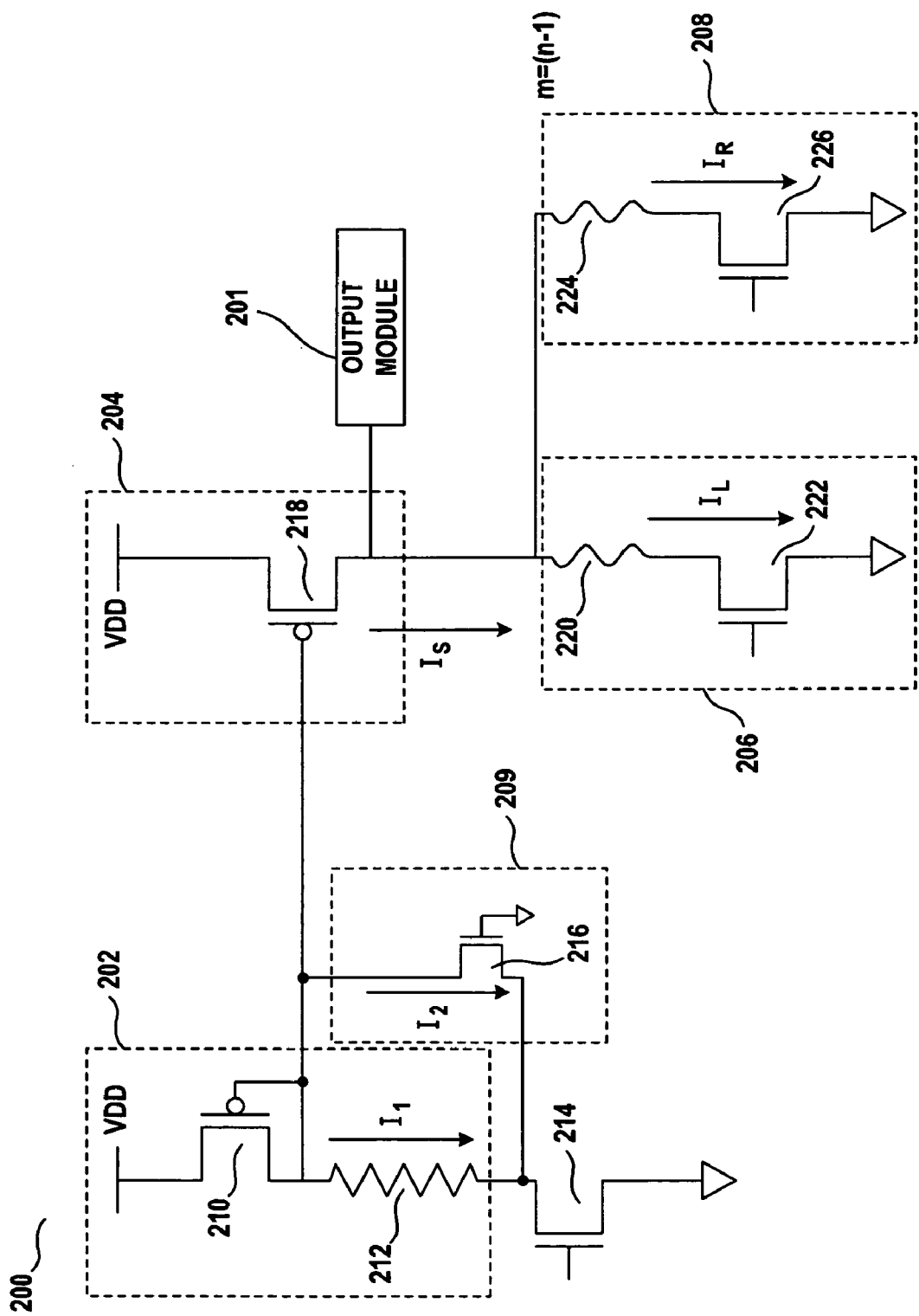
FIG. 2 schematically illustrates a sense amplifier for electrical fuse cells in accordance with one embodiment of the present invention.

FIG. 2 schematically illustrates a sense amplifier 200 for a plurality of electrical fuse cells in accordance with one embodiment of the present invention. The sense amplifier 200 includes an output module 201, a bias module 202, and a current supplier 204, which is coupled to a selected electrical fuse cell 206 and a number of unselected electrical fuse cells 208. The sense amplifier 200 further includes a tracking module 209 coupled to the bias module 202 and the current supplier 204.

The bias module 202 includes a PMOS transistor 210 having a gate and a drain coupled together and a source coupled to a power supply denoted as VDD. A load 121 is coupled to the drain and gate of the PMOS transistor 210. A switch device 214, such as an NMOS transistor, is coupled between the load 212 and a complementary power supply such as ground. The tracking module 209 includes a number of parallelly connected switch devices, which are depicted and represented by one NMOS transistor 216. The drain of the NMOS transistor 216 is coupled to the gate and drain of the PMOS transistor 210. The source of the NMOS transistor 216 is coupled to the drain of the switch device 214. The gate of the NMOS transistor 216 is coupled to a complementary power supply such as ground and remains constantly off. It noted that the NMOS transistor 216 can be substituted by a PMOS transistor, bipolar transistor or other devices, as long as it functions as a switch that can be constantly turned off.

The current supplier 204 includes a PMOS transistor 218 having a source coupled to the power supply VDD, a gate coupled to the gate of the PMOS transistor 210 and the drain of the NMOS transistor 216. The drain of the PMOS transistor 218 is coupled to the output module 201 and further coupled to the selected electrical fuse cell 206 and the unselected fuse cells 208. The selected electrical fuse cell 206 includes an electrical fuse 220 coupled to the NMOS transistor 218. A switch device, such as an NMOS transistor 220, is coupled between the electrical fuse 220 and a complementary power supply such as ground. The unselected electrical fuse cells 208 include a set of electrical fuses, represented by one fuse 224, and switch devices, represented by one NMOS transistor 226. Note that while there is only one set of fuse and switch device is depicted in the box showing the unselected electrical fuse cells 208, it conceptually represents n−1 unselected electrical fuse cells where n is the total number of the electrical fuse cells.

In operation, the switch device 214 is turned on to allow an electrical current flowing from the power supply VDD to the complementary power supply, such as ground, through the PMOS transistor 210 and the load 212. Ideally, the electrical current would not flow through the tracking module 209, since the switch devices, which are represented by the NMOS transistor 216, are turned off. However, in reality, the switch devices would not remain off perfectly, and the electrical current would leak therethrough to the complementary power supply. The current flowing through the load 212 is denoted as $I_1$, and the current leaking through the tracking module 209 is denoted as $I_2$.

The bias module 202, the tracking module 209 and the current supplier 204 together work as a current mirror, such that the sum of $I_1$ and $I_2$ multiplied by a predetermined constant c is substantially equal to the sensing current Is generated by the current supplier 204, where the constant can be set by adjusting the value of the load 212. The following equation can be obtained: $Is=c(I_1+I_2)$.

Ideally, the electrical current would not flow through the unselected electrical fuse cells 208, since the switch devices therein are turned off. However, in reality, the switch devices would not remain off perfectly, and the electrical current would leak therethrough to the complementary power supply. As a result, the sensing current Is is diverted into a first sub-current $I_L$ flowing to the selected electrical fuse cell 206 in which the switch device 222 is turned on, and a second sub-current $I_R$ flowing to the unselected fuse cells 208 in which the switch devices represented by the NMOS transistor 226 are turned off. Thus, the sensing current Is is substantially equal to the sum of the first sub-current $I_L$ and the second sub-current $I_R$. Algebraically, $Is=(I_L+I_R)$. The following equation can therefore be obtained: $cI_1+cI_2=I_L+I_R$.

Since c is a known constant, $cI_2$ can be set equal to $I_R$ by adjusting the number of the switch devices within the tacking module 209. For example, the switch devices represented by the NMOS transistor 216 can be made identical to the switch devices represented by the NMOS transistor 226 in the unselected electrical fuse cells 208, with its number equal to the number of switch devices represented by the NMOS transistor 226 divided by the predetermined constant c. In this embodiment, the total number of the electrical fuse cells is n, and the number of the unselected electrical fuse cells 208 is m, which equals to n−1. Thus, the number of the switch device in the tacking module 209 can be set as m/c. If the effect of the selected electrical fuse cell 206 is negligible, the number of the switch devices in the tacking module 209 can be set as n/c. For example, for an electrical fuse array with 128 cells and the predetermined constant c equal to 8, the number of the switch devices in the tacking module 209 can be set as 16, thereby rendering $cI_2$ substantially equal to $I_R$. As such, the influence of the leakage current $I_R$ can be compensated by properly setting the number of the switch devices in the tracking module 209.

Figure 3A:
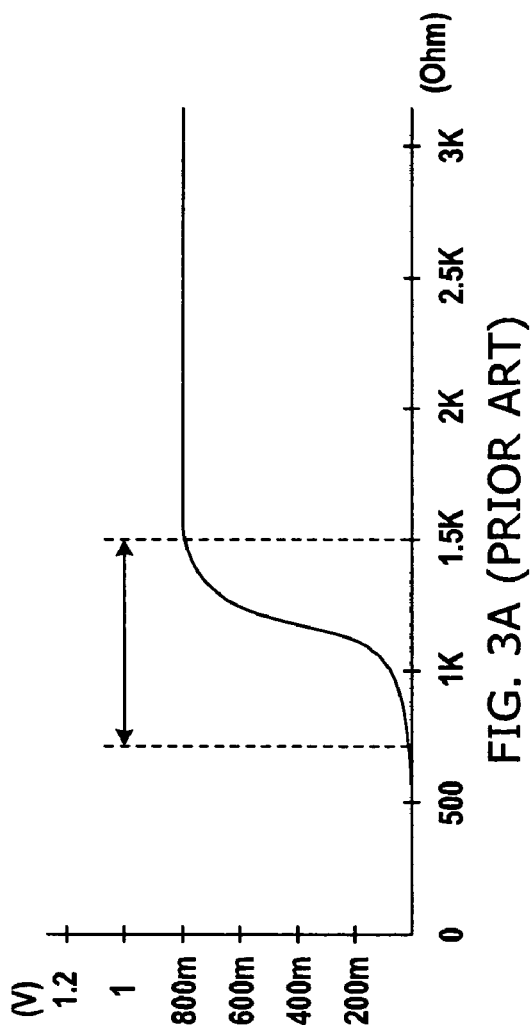
FIG. 3A illustrates a graph showing the relationship between the voltage of output signal and the resistance of fuse cell for the conventional sense amplifier.

Referring to FIG. 3A and FIG. 1, a graph 300 shows the conventional relationship between the voltage of output signal generated by the output module 101 and the resistance of electrical fuse 114 in the selected electrical fuse cell 106. The output signal voltage is at a low level when the electrical fuse 114 is programmed below about 750 ohms, while it is at a high level when the electrical fuse is programmed above about 1,500 ohms. Due to the leakage current $I_R$, the transition from the low level to the high level takes a rather large range of resistance from about 750 to 1,500 ohms. This means that it would be difficult to ascertain if the fuse 114 is "blown" or not, when its resistance falls in the transition range.

Figure 3B:
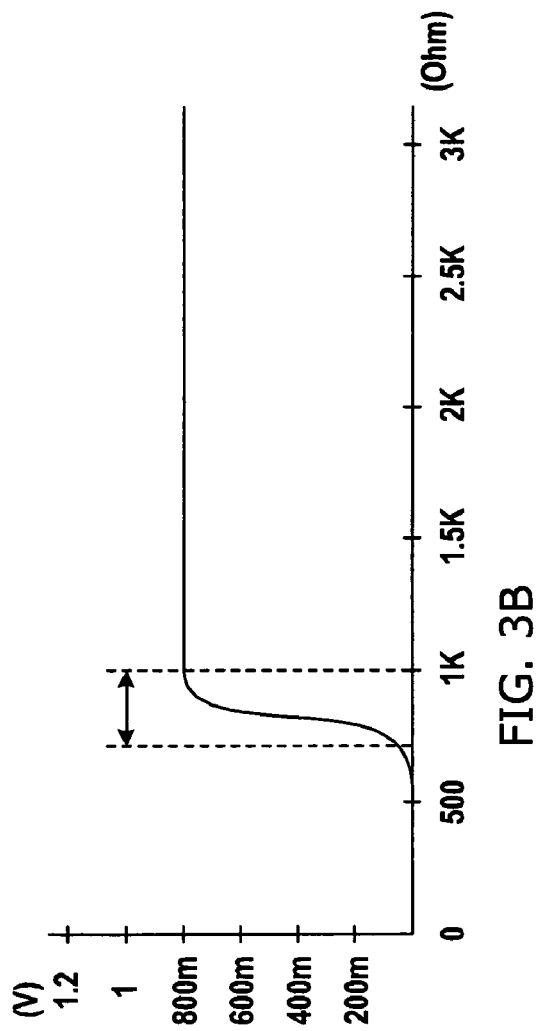
FIG. 3B illustrates a graph showing the relationship between the voltage of output signal and the resistance of fuse cell for the sense amplifier in accordance with the embodiment of the present invention.

Referring to FIG. 3B and FIG. 2, a graph 400 shows the relationship between the voltage of output signal generated by the output module 201 and the resistance of electrical fuse 220 in the selected electrical fuse cell 222 in accordance with one embodiment of the present invention. The output signal voltage is at a low level when the electrical fuse 220 is programmed below about 750 ohms, while it is at a high level when the electrical fuse is programmed above about 1,000 ohms. Since the leakage current $I_R$ has been compensated, the transition from the low level to the high level takes a rather small range of resistance from about 750 to 1,000 ohms. This means that it would be easier to ascertain if the fuse 220 is "blown" or not, when its resistance falls in this rather small transition range.

It is understood by those skilled in the art of circuit design that while the transistors 210 and 218 are P-type in this embodiment, they can be substituted by N-type NMOS transistors with proper adjustments as an alternative embodiment of the present invention.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A sense amplifier for detecting a logic state of a selected electrical fuse cell, comprising:
   a bias module coupled to a power supply for generating a first current;
   a tracking module coupled to the bias module for generating a second current; and
   a current supplier coupled to the bias module and the tracking module for generating a third current substantially equal to a sum of the first and second currents scaled by a predetermined factor, the third current being diverted into a first sub-current flowing through the selected electrical fuse cell and a second sub-current leaking through unselected electrical fuse cells, wherein the tracking module is so configured that the second current scaled by the predetermined factor is substantially equal to the second sub-current.

2. The sense amplifier of claim 1 wherein the tracking module has one or more parallelly connected switch devices coupled between the bias module and the current supplier, the switch devices having a number substantially equal to the number of the unselected electrical fuse cells divided by the predetermined factor.

3. The sense amplifier of claim 2 wherein the switch devices remain off.

4. The sense amplifier of claim 3 wherein the bias module comprises a first PMOS transistor having a gate and a drain coupled together and a source coupled to the power supply.

5. The sense amplifier of claim 4 wherein the bias module comprises a load coupled to the drain and gate of the first PMOS transistor in parallel with the switch devices.

6. The sense amplifier of claim 5 wherein the current supplier comprises a second PMOS transistor having a source coupled to the power supply, a gate coupled to the gate of the first PMOS transistor and the switch devices, and a drain coupled to the selected and unselected electrical fuse cells.

7. The sense amplifier of claim 6 wherein each one of the selected or unselected electrical fuse cells comprises at least one electrical fuse coupled to the drain of the second PMOS transistor, and at least one cell switch device coupled between the electrical fuse and a complementary power supply.

8. The sense amplifier of claim 7 further comprising an output module coupled to the drain of the second PMOS transistor for outputting a signal indicative of the logic state of the selected electrical fuse cell.

9. A sense amplifier for detecting a logic state of a selected electrical fuse cell among a number of unselected electrical fuse cells, comprising:
    a bias module coupled to a power supply for generating a first current;
    a tracking module, having one or more switch devices of a number substantially equal to the number of the unselected electrical fuse cells divided by a predetermined factor, coupled to the bias module for generating a second current; and
    a current supplier coupled to the bias module and the tracking module for generating a third current substantially equal to a sum of the first and second currents multiplied by the predetermined factor, the third current being diverted into a first sub-current flowing through the selected electrical fuse cell and a second sub-current leaking through the unselected electrical fuse cells,
    wherein the tracking module is so configured that the second current multiplied by the predetermined factor is substantially equal to the second sub-current, thereby avoiding the first sub-current to be reduced by the second sub-current.

10. The sense amplifier of claim 9 wherein the switch devices remain off.

11. The sense amplifier of claim 10 wherein the bias module comprises a first PMOS transistor having a gate and a drain coupled together and a source coupled to the power supply.

12. The sense amplifier of claim 11 wherein the bias module comprises a load coupled to the drain and the gate of the first PMOS transistor in parallel with the switch devices.

13. The sense amplifier of claim 12 wherein the current supplier comprises a second PMOS transistor having a source coupled to the power supply, a gate coupled to the gate of the first PMOS transistor and the switch devices, and a drain coupled to the selected and unselected electrical fuse cells.

14. The sense amplifier of claim 13 wherein each one of the selected or unselected electrical fuse cells comprises at least one electrical fuse coupled to the drain of the second PMOS transistor, and at least one cell switch device coupled between the electrical fuse and a complementary power supply.

15. The sense amplifier of claim 14 further comprising an output module coupled to the drain of the second PMOS transistor for outputting a signal indicative of the logic state of the selected electrical fuse cell.

16. An integrated circuit for detecting a logic state of a selected electrical fuse cell among a number of unselected electrical fuse cells, comprising:
    a bias module coupled to a power supply for generating a first current;
    a tracking module, having one or more switch devices of a number substantially equal to the number of the unselected electrical fuse cells divided by a predetermined factor, coupled to the bias module for generating a second current;
    a current supplier coupled to the bias module and the tracking module for generating a third current substantially equal to a sum of the first and second currents multiplied by the predetermined factor, the third current being diverted into a first sub-current flowing through the selected electrical fuse cell and a second sub-current leaking through the unselected electrical fuse cells; and
    an output module coupled to the third current for outputting a low signal when the fuse of the selected fuse cell is not blown, and a high signal when the fuse of the selected fuse cell is blown,
    wherein the tracking module is so configured that the second current multiplied by the predetermined factor is substantially equal to the second sub-current, thereby avoiding the first sub-current to be reduced by the second sub-current.

17. The integrated circuit of claim 16 wherein the switch devices remain off.

18. The integrated circuit of claim 17 wherein the bias module comprises a first PMOS transistor having a gate and a drain coupled together and a source coupled to the power supply.

19. The integrated circuit of claim 18 wherein the bias module comprises a load coupled to the drain and the gate of the first PMOS transistor in parallel with the switch devices.

20. The integrated circuit of claim 19 wherein the current supplier comprises a second PMOS transistor having a source coupled to the power supply, a gate coupled to the gate of the first PMOS transistor and the switch devices, and a drain coupled to the selected and unselected electrical fuse cells.

* * * * *